(12) United States Patent
Nicolas et al.

(10) Patent No.: US 7,800,085 B2
(45) Date of Patent: Sep. 21, 2010

(54) MICROELECTRONIC MULTIPLE ELECTRON BEAM EMITTING DEVICE

(75) Inventors: Pierre Nicolas, Saint Egreve (FR); Yohan Desieres, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 381 days.

(21) Appl. No.: 11/814,228

(22) PCT Filed: Jan. 24, 2006

(86) PCT No.: PCT/FR2006/050047

§ 371 (c)(1), (2), (4) Date: Jul. 18, 2007

(87) PCT Pub. No.: WO2006/079741

PCT Pub. Date: Aug. 3, 2006

(65) Prior Publication Data

US 2008/0169429 A1   Jul. 17, 2008

(30) Foreign Application Priority Data

Jan. 27, 2005   (FR) .................................. 05 50235

(51) Int. Cl.
G01J 1/58   (2006.01)

(52) U.S. Cl. .............. 250/494.1; 250/492.1; 250/492.2; 250/492.3; 250/493.1

(58) Field of Classification Search .............. 250/458.1, 250/492.1, 492.2, 492.3, 493.1, 494.1
See application file for complete search history.

(56) References Cited

U.S. PATENT DOCUMENTS

| 5,131,584 | A  |   | 7/1992  | Boitel et al. |
| 5,270,611 | A  |   | 12/1993 | Van Gorkom |
| 5,892,231 | A  | * | 4/1999  | Baylor et al. ............... 250/398 |
| 5,903,108 | A  | * | 5/1999  | Mougin et al. ........... 315/169.1 |
| 6,028,391 | A  | * | 2/2000  | Makishima ................. 313/310 |
| 6,031,657 | A  | * | 2/2000  | Robinson et al. ........... 359/293 |
| 6,713,970 | B2 | * | 3/2004  | Bancal ..................... 315/169.1 |
| 6,784,438 | B2 | * | 8/2004  | Yoo et al. ................... 250/399 |
| 7,332,736 | B2 | * | 2/2008  | Jin .............................. 257/10 |

(Continued)

FOREIGN PATENT DOCUMENTS

| FR |     2 809 862 A1 |   | 12/2001 |
| WO | WO 03/041039     | * | 5/2003  |
| WO | WO 03/054901 A2  |   | 7/2003  |

OTHER PUBLICATIONS

R. Baptist, "Ecrans Fluorescents a' Micropointes", L'onde E'lectrique, vol. 71, No. 6, Nov.-Dec. 1991, pp. 36-42. (with English Abstract).

Yohan Desieres, et al, "Optical and Electrical Studies of a Single Spindt-Type Field Emitter", Technical Digest of the 17th International Vacuum Microelectronics conference, Jul. 12-16, 2004, pp. 174-175.

(Continued)

*Primary Examiner*—Bernard E Souw
*Assistant Examiner*—Michael J Logie
(74) *Attorney, Agent, or Firm*—Oblon, Spivak, McClelland, Maier & Neustadt, L.L.P.

(57) ABSTRACT

An electronic emission device emitting plural beams of electrons and including a first structure of a plurality of electron beam emission micro-sources, and a second structure opposite the first structure for collecting electrons emitted by the first structure and for carrying out a secondary emission following the collection. The device can be applied in particular to the field of direct writing lithography.

23 Claims, 6 Drawing Sheets

U.S. PATENT DOCUMENTS

| | | | |
|---|---|---|---|
| 2002/0053867 | A1 | 5/2002 | Van Der Vaart et al. |
| 2003/0062488 | A1* | 4/2003 | Fink et al. ............ 250/492.3 |
| 2003/0067041 | A1* | 4/2003 | Geusic et al. ............ 257/366 |
| 2004/0021623 | A1* | 2/2004 | Nicolas et al. ............ 345/74.1 |
| 2004/0084637 | A1 | 5/2004 | Yoo et al. |
| 2004/0127012 | A1* | 7/2004 | Jin ............ 438/618 |
| 2004/0256976 | A1 | 12/2004 | Van Der Vaart et al. |
| 2007/0125753 | A1* | 6/2007 | Fink et al. ............ 219/121.13 |
| 2008/0217302 | A1* | 9/2008 | Fink et al. ............ 219/121.13 |

OTHER PUBLICATIONS

L. R. Baylor, et al., "Initial lithography results from the digital electrostatic e-beam array lithography concept", Journal of Vacuum Science and Technology, XP002348948, vol. 22, No. 6, Nov. 2004, pp. 3021-3024.

J. Dijon, et al., "Cathode Structures for Carbon Nanotube Displays", International Display Research Conference, 2002, pp. 821-824.

K. Sakai, et al., "Flat Panel Displays Based on Surface-Conduction Electron Emitters", Proceedings of the $16^{TH}$ International Display Research Conference, pp. 569-572.

E. J. Fantner, et al., "New Tools for Nanotechnology", IMS Nanofabrication GmbH, Oct. 1-2, 2003, pp. 1-16.

N. C. Van Der Vaart, et al., "A Novel Cathode for CRTs based on Hopping Electron Transport", Philips Research Laboratories, 2002, pp. 1392-1394.

P. J. A. Derks, et al., "Technology for the Hopping Electron Cathode", LG Philips Displays, 2002, pp. 1396-1399.

C. A. Spindt, "A Thin-Film Field-Emission Cathode", Applied Physics Laboratory, No. 39, 1968, pp. 3504-3505.

R. Meyer, et al., "Microtips Fluorescent Display", Proceedings of the $6^{TH}$ International Display Research Conference, 1986, pp. 512-515.

C.A. Spindt, et al., "The Nature and Management of Emission Fluctuations in Spindt Cathodes", Vaccum Microelectronics, 2001, pp. 166-171.

* cited by examiner

MICROELECTRONIC MULTIPLE ELECTRON BEAM EMITTING DEVICE

TECHNICAL FIELD AND PRIOR ART

The present invention concerns electronic emission devices and, in particular, a "multi-beam" emission device capable of emitting several beams of electrons at the same time, comprising several primary emission sources of electrons in parallel, associated with means for collecting the electrons from the primary sources and for emitting several beams of secondary electrons following said collection.

The invention finds applications particularly in the field of direct writing lithography of thin films, for example during processes for forming integrated circuits or/and micro-systems.

Within the context of the manufacture of microelectronic devices such as integrated circuits or/and microstructures such as MEMS (Micro Electro Mechanical Systems), one continually seeks to reduce the minimum resolution or critical dimension of patterns that one is brought about to form in the thin films.

The formation of one or several patterns on a thin film usually involves a photolithography process during which one exposes to light a layer, for example based on photosensitive resin, by means of a luminous beam, in particular ultraviolet, and through a mask reproducing the patterns that one wishes to form in said thin film. The minimum resolution of the patterns formed in the resin layer then depends on the wavelength of the light beam used. The wavelengths employed today in such processes are shorter and shorter, which makes the cost of these photolithography processes increasingly expensive, and brings these processes nearer to the limit domain of usable wavelength, in particular the domain of the extreme ultraviolet. As a consequence, these processes are on the point of reaching a limit of resolution beyond which it seems difficult to further reduce the minimum measurements or critical dimensions of patterns.

Lithography processes that do not make use of a mask, known as "direct writing lithography", especially by beams of electrons, have appeared. The minimum resolution that one is likely to obtain by means of such beams is less than that which may be obtained by means of UV ray photolithography processes, Direct writing lithography devices using a single beam of electrons, of width between for example 5 and 20 nm diameter, have been produced. Such a range of beam width leads to long writing times of a thin film and to a use of such a device, in particular within the scope of an industrial production, restricted to the exposure or the writing of zones of thin films of limited extent.

In order to reduce the writing time of the direct writing lithography, a solution described in the document of L. R. Baylor et al. "Initial lithography results from the digital electrostatic e-beam array lithography concept, J. Vac. Sci. Technol. B22(6), November/December 2004" consists in using a matrix of electron emitters in order to carry out a writing or a lithography of several zones in parallel of the thin film, by means of several beams of electrons. An example of "multi-beam" electronic emission device according to the prior art, comprising such a matrix, is illustrated in FIG. 1A.

This matrix may be formed on a semi-conductor substrate 10 and comprise a plurality of electron emitters or electron emitter pixels 11a, 11b, for example field effect type emitters also known as "cola emitters". These emitters 11a, 11b, may each be formed of a microtip 12, lying on a metallic layer 13 and surrounded on either side by an extraction gate 15. Such microtips 12 use the principle of emission by tunnel effect through an emitter-vacuum barrier. The intensity of electron beams emitted by the emitters 11a and 11b may be adjusted by a respective control circuit 16a, 16b, specific to each emitter 11a, 11b.

A first disadvantage linked to the use of such a matrix is the lack of uniformity, from the point of view of intensity, which can appear between the beams from the different emitters 11a and 11b. This lack of uniformity is illustrated in FIG. 2A, by the curves $C_1$ and $C_2$, representative of the respective current-voltage characteristics of the emitter 11a and the emitter 11b. These instabilities may be due especially to the manner in which the microtips 12 have been formed, and in particular differences of shape or/and size between said microtips 12.

Each emitter element 11b may also experience specific instabilities, and especially "spatial" instabilities of the beam that it emits. Such instabilities are illustrated in FIG. 2B, by the width variations between a beam of electrons 20, which, emitted at a time $t_1$ by a microtip 12, has a given width, and this same beam 21, which, emitted at another time $t_2$ after the time $t_1$, has a width different to the given width. These instabilities may be due to the existence of several different emission sites on a same microtip 12 of an emitter 11b.

Each emitter element 11b may also experience instabilities over time (FIG. 2C) with regard to the intensity of the beam that it emits. These instabilities may be due to a fluctuation over time of the number of electron emitter sites with which a microtip 12 is provided.

To carry out a lithography of a thin film, for example based on resin, by means of such a device, it is necessary to control the quantity of charges deposited on said resin. The control of this charge necessitates the proper control of a current emitted/exposure time pairing, and this holds for each individual emitter of the matrix. The disadvantages and instabilities cited above make this control difficult. The stability of the emitters may also be affected by the quality of the vacuum as well as by the nature of the gases present in the enclosures in which the lithography is carried out, in particular due to degassing induced by the resin writing. To offset the different problems evoked above, a solution consists in using specific regulation integrated circuits (ASIC for Application Specific Integrated Circuit, for example of CMOS (Complementary Metal Oxide Semiconductor) type as respective control circuits 16a, 16b of each emitter 11a, 11b. This type of proximity circuit takes up space and thereby considerably limits the number of emitters that the matrix is capable of comprising. These control circuits may moreover have a correct operation providing that the emitters 11a, 11b have a sufficient signal to noise ratio. In certain cases, if the variations in the current emitted by the emitters 11a, 11b are too abrupt or/and too intense, the ASIC control circuit may no longer be able to carry out correction.

DESCRIPTION OF THE INVENTION

The present invention makes it possible in particular to reduce the phenomena of temporal and spatial instability of beams of electrons and lack of uniformity between said beams in "multi-beam" electron emitter devices.

The invention concerns an electron emitter device, in particular microelectronic and/or formed in thin films, and capable of emitting several beams of electrons, comprising:

first means comprising at least one first substrate and a plurality N1 (where N1 is a integer greater than 1) of sources or micro-sources of electrons formed on a first substrate, second means capable of collecting electrons from said micro-sources and emitting other electrons following this collection, said second means comprising at least one layer known as "collection layer" located opposite the micro-sources and in which is formed a plurality of secondary electron emitters, for example a plurality or a number N2 (N2>1) of openings.

The number N2 of openings may be different, for example less than or much less than the number N1 of micro-sources. This may enable each of the openings to emit a secondary beam of electrons, resulting from a collection of electrons from different primary electron sources. N1 may be for example greater than or equal to 100*N2, or greater than or equal to 1000*N2.

Certain micro-sources may if necessary be situated opposite the openings, whereas one or several micro-sources may be situated opposite a non openwork portion of the collection layer. For instance, certain non openwork parts of the collection layer are capable of being bombarded by micro-sources of electrons situated opposite.

The openings may have a diameter around nanometer size, which may be between 1 and 50 nanometers or between 1 and 100 nanometers, and may form secondary sources of electrons of nanometric dimension, or sources that will be named "nano-sources".

The uniformity of the beams of electrons emitted with such a device is improved compared to that of devices of the prior art. This uniformity depends more on the way in which the secondary emitters or the openings belonging to the second means have been manufactured, than that in which the primary emitters belonging to the first means have been manufactured.

The temporal stability of each beam emitted by such a device may also be improved compared to that of beams emitted by devices of the prior art. The instabilities may be reduced up to a factor $\sqrt{K}$, where K is the number of micro-sources or primary emitters of the first means, compared to the number of secondary emitters or openings of the second means.

The number of micro-sources in such a device may be high. Since these micros-sources are associated with secondary sources, such a device is also improved in terms of reliability, in so far as any failure of several micro-sources may not disrupt or disrupt very little the operation of the device, and in particular the formation of secondary beams from the second means.

In such a device, the micro-sources or/and the openings may be arranged in a matrix. The first means may comprise a matrix of pixels, for which each pixel comprises several micro-sources and is associated with a nano-source or an opening of the second means.

According to several embodiment possibilities, the micro-sources may be for example microtips or "Spindt tips", or carbon nanotubes, or nanofissures capable of emitting electrons.

The collection layer may comprise a material favouring the secondary emission, or a material of secondary emission coefficient greater than 1.

The first means may comprise an element, playing the role of cathode or several elements playing the role of cathodes, and a plurality of micro-sources per cathode. These different cathodes may be arranged according to a matrix.

According to one embodiment possibility, the first means and the second means may be "hybridized" or made integral by one or several conductor elements, for example metallic beads to form a structure.

The collection layer of the second means may belong to a stacking of several thin films. This stacking may comprise, on either side of the collection layer, at least one conductor layer capable of forming a first electrode and at least one other conductor layer capable of forming a second electrode.

These electrodes may be provided, when they are polarised, to apply an electrical field making it possible to direct the secondary electrons emitted or sent back by the collection layer towards said openings, and to accelerate these electrons when they pass through said openings.

In the case where the first means and the second means are attached by one or several conductor elements, for example conductive beads, the first electrode and the second electrode may be polarised by means of one or several circuits integrated with the first substrate. These supply circuits are thereby electrically connected to the first and to the second electrode, via said conductor elements.

According to one embodiment possibility, the collection layer may be a thin film based on an insulating material, for example a ceramic material that may be covered with another insulating material of secondary emission coefficient greater than 1, such as for example MgO.

The microelectronic electronic emission device according to the invention may further comprise: a micro-source addressing circuit integrated with the first substrate. This addressing circuit may if necessary be common to all of the micro-sources. The addressing carried out by this circuit may be of "active matrix" type.

The constraints for manufacturing such a device are also reduced compared to devices of the prior art, particularly as regards the addressing circuit. The device according to the invention may comprise a simpler and less cumbersome addressing circuit than ASIC type addressing circuits. Given the possibility of operating in parallel a high number of micro-sources in the device according to the invention, the current required per micro-source is reduced. For instance, the range of micro-source control voltages applied by the addressing circuit of the device according to the invention may be less than that applied in devices of the prior art. This may make it possible to produce the integrated addressing circuit in faster technological channels and using voltage ranges lower than those of addressing circuits of electron emitter devices according to the prior art.

The reduction of constraints for manufacturing the control or addressing integrated circuit and the space savings in the first substrate linked to this reduction may make it possible to obtain an important writing pass band and a higher writing rate of each of the beams emitted by the device than with devices according to the prior art.

According to an alternative embodiment, the microelectronic electron emission device according to the invention may comprise among said plurality of micro-sources a first plurality of micro-sources lying on a first conducting zone and forming with this first conducting or semi-conducting zone a first cathode, and at least one other plurality of micro-sources lying on a second conducting zone, and forming with this second conducting or semi-conducting zone a second cathode, isolated from, or disjointed from, or which is not in contact with the first zone.

For instance, the first means may comprise, on the first substrate, at least one first cathode and at least one second cathode isolated or disjointed from the first cathode, sharing the same addressing circuit as the first cathode, A direct writing lithography device, comprising a microelectronic device capable of emitting several beams as defined above is provided within the scope of the invention.

This lithography device may further comprise: means for focusing beams of electrons, for example electrostatic or/and magnetic devices, for example a magnetic projection system, or a system combining electrostatic and/or magnetic lenses. Such a lithography device may further comprise means forming an anode. This anode may be for example a polarised semi-conductor wafer, covered with a thin film in which one wishes to form patterns.

A device for inspecting microelectronic devices such as integrated circuits, semi-conductor wafers covered with thin films, chips, or photolithography masks, comprising a device capable of emitting several beams such as defined above, is also provided within the scope of the invention,

BRIEF DESCRIPTION OF DRAWINGS

The present invention will be better understood after reading the description of example embodiments given purely for information and that is in no way limitative, with reference to the appended figures, wherein.

In order to make the figures easier to read, the different parts represented in the figures are not necessarily to the same scale.

DETAILED DESCRIPTION OF SPECIFIC EMBODIMENTS

Figure 1:
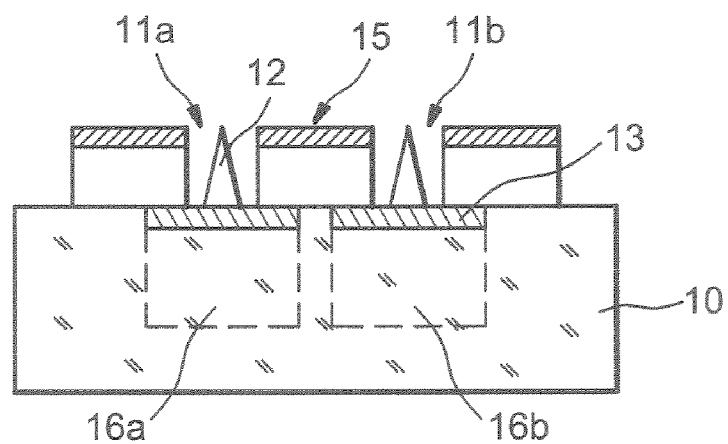
FIG. 1 represents an example of electronic emission device with several beams of electrons, according to the prior art.
Figure 2A:
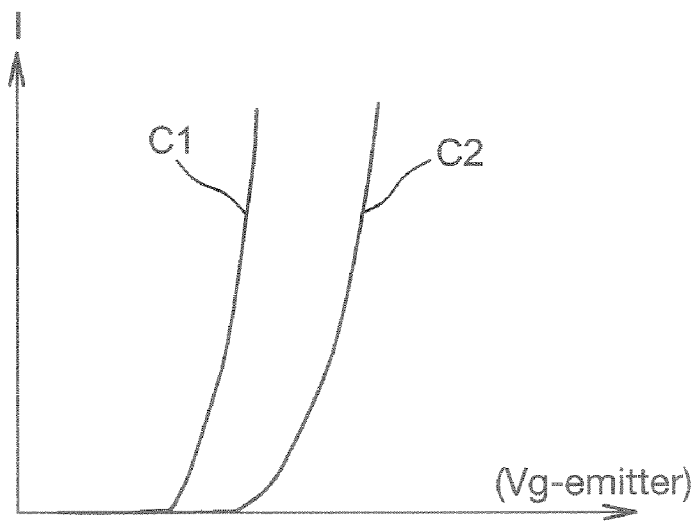
FIGS. 2A-2C illustrate defects or drifts that beams of electrons emitted by means of devices wish several beams of electrons according to the prior art may experience.
Figure 2B:
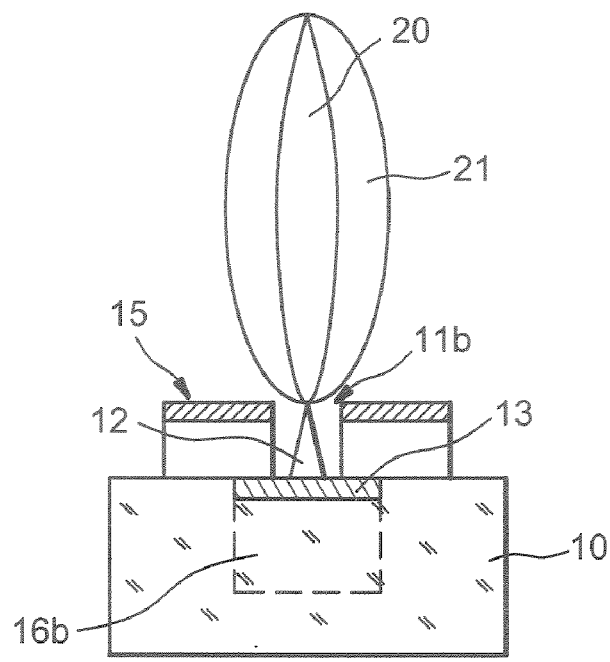
Figure 2C:
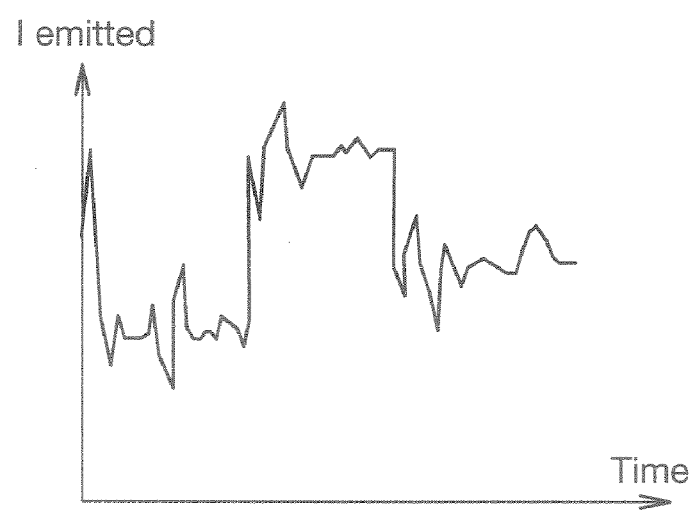
Figure 3A:
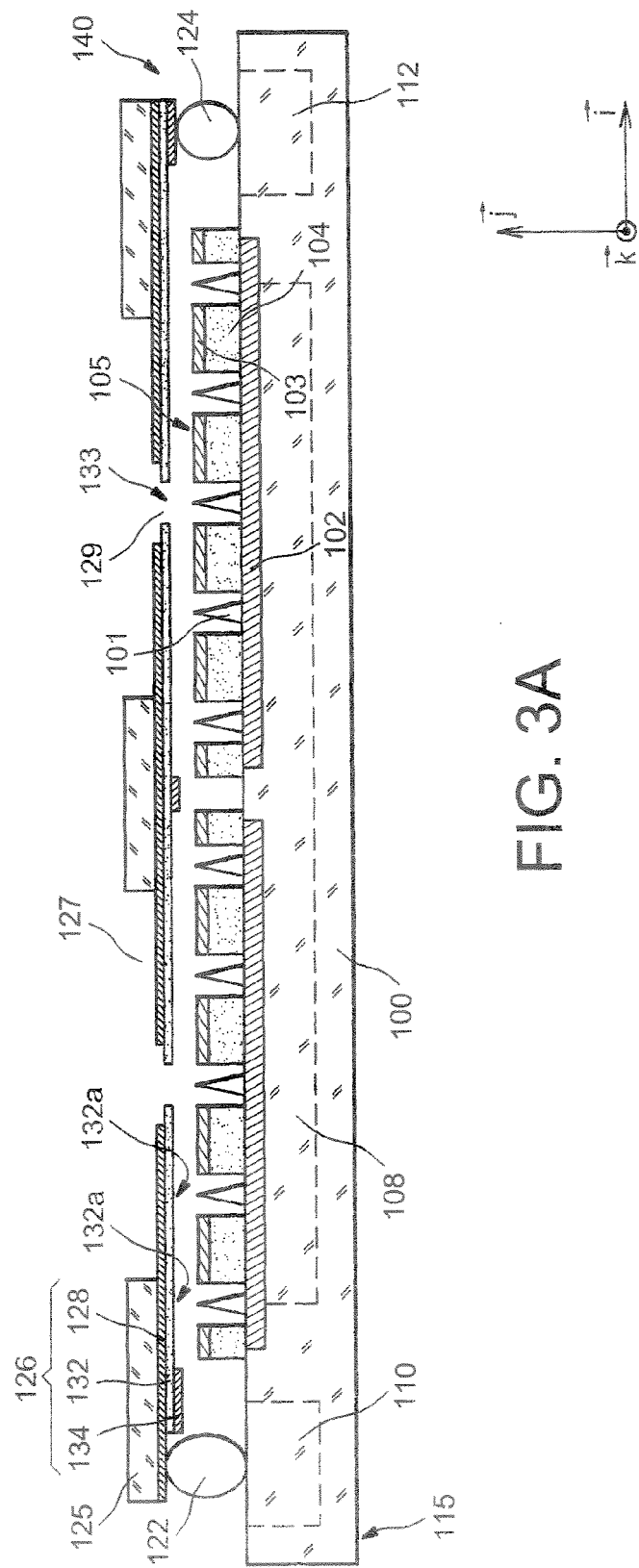
FIG. 3A represents a first example of electronic emission device with several beams of electrons according to the invention, and a stacking of thin films comprised in such a device.

A microelectronic device, used according to the invention, capable of emitting several beams of electrons, will now be described in relation to FIG. 3A.

This device firstly comprises a first structure or first means 115 formed in thin films, capable of emitting several beams of electrons. These first means 115 comprise a substrate 100 for example based on semi-conductor material, on which lies a plurality of electron emitter elements 105, for example field effect or "cold emitter" type emitters. These electron emitter elements 105 may be arranged in the form of a matrix, and will then also be known as "pixels".

Each element or pixel 105 may comprise a plurality of primary electron sources known as "micro-sources", such as for example microtips 101, or tips known as "Spindt tips", based on semi-conductor or conductor material, and of height that may be around one or several micrometers, for example 1 μm. The microtips 101 of a pixel 105 may be surrounded on either side by an extraction gate, based on a gate material 103, for example a metal such as Al, or Ti, or TiN, or Nb, lying on a gate insulator 104, for example based on SiO2 or HfO2, itself lying on a conducting or semi-conducting zone 102.

According to one possibility (not shown), a pixel 105 may comprise several juxtaposed micro-sources, for example juxtaposed microtips, arranged in an opening of a layer of material of openwork gate.

The elements or pixels 105 may comprise a conducting or semi-conducting zone capable of acting as cathode, on which the micro-sources are formed. Each element or pixel 105 may if necessary comprise a conducting or semi-conducting zone 102 on which the micro-sources are formed and which may be isolated or disjointed or not be in contact wish the respective conductive zones of other pixels.

The first means 115 may be formed of a matrix, for example between 100*100 pixels 105 and 1000*1000 pixels 105. The number of micro-sources per pixel or emitter element 105 may, for its part, be high, for example between 100 and several thousands of microtips 101 per pixel 105.

The first means 115 further comprise a circuit 108 for addressing the elements 105 of the matrix, connected to the different conductive zones 102. The addressing circuit may be manufactured for example in CMOS (Complementary Metal Oxide Semi-conductor) technology.

The addressing of the emitter elements 105 may be of the type of that of an active matrix. For instance, the pixels or emitter elements 105 of the matrix are capable of emitting at the same time. Each of these emitter elements 105 may also be respectively associated with memorisation means (not shown) specific to the addressing circuit 108. These memorisation means are capable of memorising a relative set point value at the intensity that the elements are intended to emit. This set point may be modified, if necessary individually for each pixel, by the addressing circuit, during an emission of electrons.

A second structure or second electron emitter means 140 are placed opposite the first means 115 and provided, for their part, to collect primary electrons from the micro-sources of the first structure 115 and to reemit secondary electrons following said collection.

The second structure 140 may comprise a second substrate 125, for example based on a semi-conductor material such as silicon or a conductor material, for example a metallic material, on which lies a stacking 126 of thin films placed opposite the microtips 101.

The stacking 126 may comprise in particular a metallic layer 128, structured or etched, for example based on TiN and of thickness for example around 0.1 micrometers, formed on the second substrate 125. This metallic layer 128 is intended to be polarised and to play the role of a first electrode. The metallic layer 128 is in contact with a face of an insulating layer 132, for example based on a ceramic material of thickness that may be between 0.1 μm and 1 μm.

Zones of the other face of the insulating layer 132, which are not situated opposite an emitter element 105, are covered with another structured or etched layer based on metallic material 134, for example TiN of thickness that may be between 0.1 μm and 1 μm. This other metallic layer 134 is intended to be polarised and to act as second electrode.

Certain parts noted 132a of the insulating layer 132, situated opposite microtips 101, are for their part unmasked. These parts 132a of the insulating layer 132 are intended to be bombarded by electrons from microtips 101 and to form, following said bombardment, secondary electron emission sites. The parts 132a may be covered with an insulating material, having preferably a high secondary emission coefficient, such as MgO.

The insulating layer 132 further comprises a plurality of openings 133, which may also be arranged according to a matrix, for example in such a way that each pixel 105 is situated opposite an opening and, if necessary, a single opening. The openings 133 may have a diameter of around several nanometers, or between 1 nanometer and 50 nanometers, for example around 10 nanometers.

The openings 133 may form secondary electron emission sources that we will call "nano-sources". The number of openings 133, situated opposite an emitter element 105 or a pixel of the first matrix may be different to that of the number of microtips 101 or micro-sources of said pixel 105. The number of openings 133 in the matrix may be between for example several hundreds and 1 million. The total number of openings 133 of the second structure may be considerably less than that of the number of microtips or micro-sources of the first structure. An opening 133 may be associated with several micro-sources.

For instance, a nano-source may be provided to collect electrons from several different primary micro-sources of electrons and to carry out a resulting secondary emission of electrons, following said collection, and thereby make it possible to carry out a temporal or/and spatial averaging of the emission from the primary sources. The diameter of the openings 133 is provided to allow a precise spatial localisation of the resulting secondary emission.

Figure 4A:
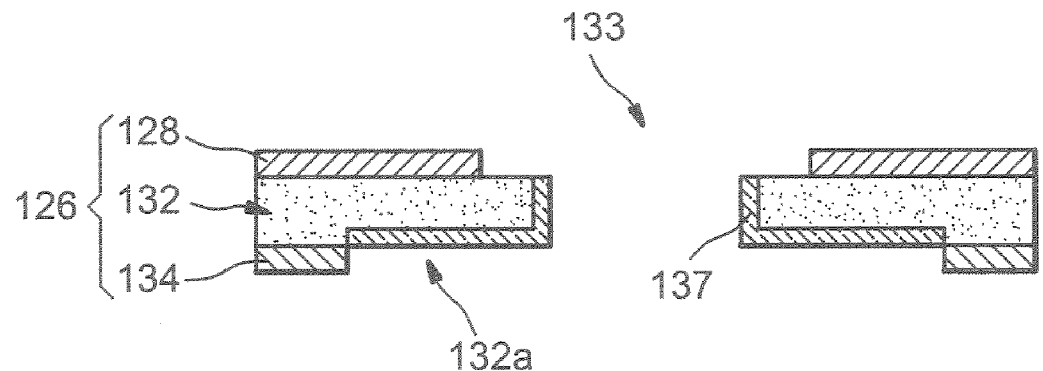
FIGS. 4A and 4E represent varieties of stackings of thin films comprised in a device according to the invention.

According to an alternative embodiment of the stacking 126, illustrated in FIG. 4A, the openings 133 may comprise walls covered with a material 137 that makes it possible to favour the secondary emission, such as for example MgO. Thus, the walls of the openings 133 and the parts 132a of the layer 132 may be covered with a material favouring she secondary emission.

Figure 4B:
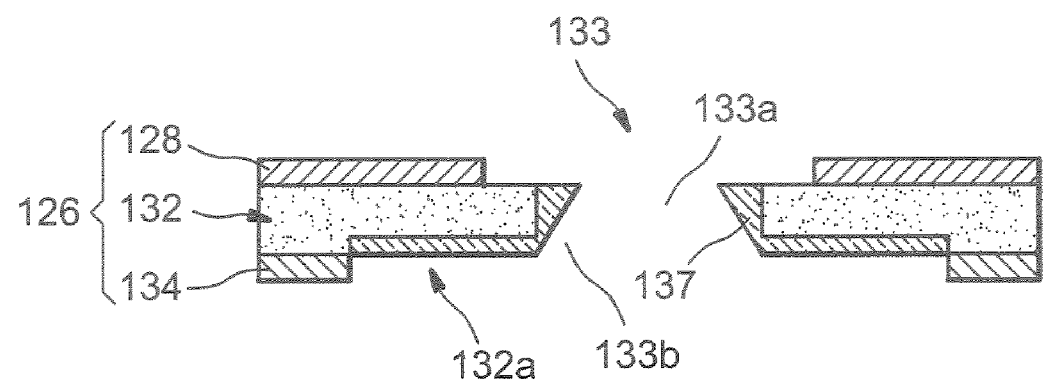

According to an embodiment variant of the stacking 126, illustrated in FIG. 4B, the openings 133 may also have a bevel shape and/or comprise a first mouth 133a, located on the side of the face on which lies the conductor layer 128 or first electrode, of section less than its other mouth 133b, located on the side of the face on which lies the layer based on conductor material 134 or second electrode.

To enable the passage of beams of electrons through the stacking 126 and the substrate 125, the first metallic layer 128 comprises orifices 129 in the extension of the openings 133 of diameter for example around 1 µm, whereas the second substrate 125 comprises orifices 127 of diameter for example around 10 µm in the extension of the orifices 129 (the diameters of the openings 133, orifices 129 and 127 being measured in directions parallel to a vector $\vec{i}$ of an orthogonal mark [$O$; $\vec{i}$; $\vec{j}$; $\vec{k}$] indicated in FIG. 3A).

The second structure 140, may be attached or mechanically linked or integrated with the first structure 115. In this example, the second structure 140 lies on the conductor elements formed on either side of the first structure 110. The second structure 140 is thereby maintained by said conductor elements above the first structure, at a distance for example of around several micrometers or several hundreds of micrometers. These conductor elements may be for example metallic beads 122 and 124, known as "hybridization beads" of diameter between for example several micrometers and several hundreds of micrometers, based on a metal or a metal alloy, if necessary meltable. The conductor elements 122 and 124 are respectively in contact with the metallic layer 128 acting as first electrode and with the metallic material 134 acting as second electrode, and respectively making it possible to electrically connect the first electrode to first means of supply 110 integrated with the first substrate 100, and the second electrode, to second means of supply 112 also integrated with the first substrate 100.

Figure 3B:
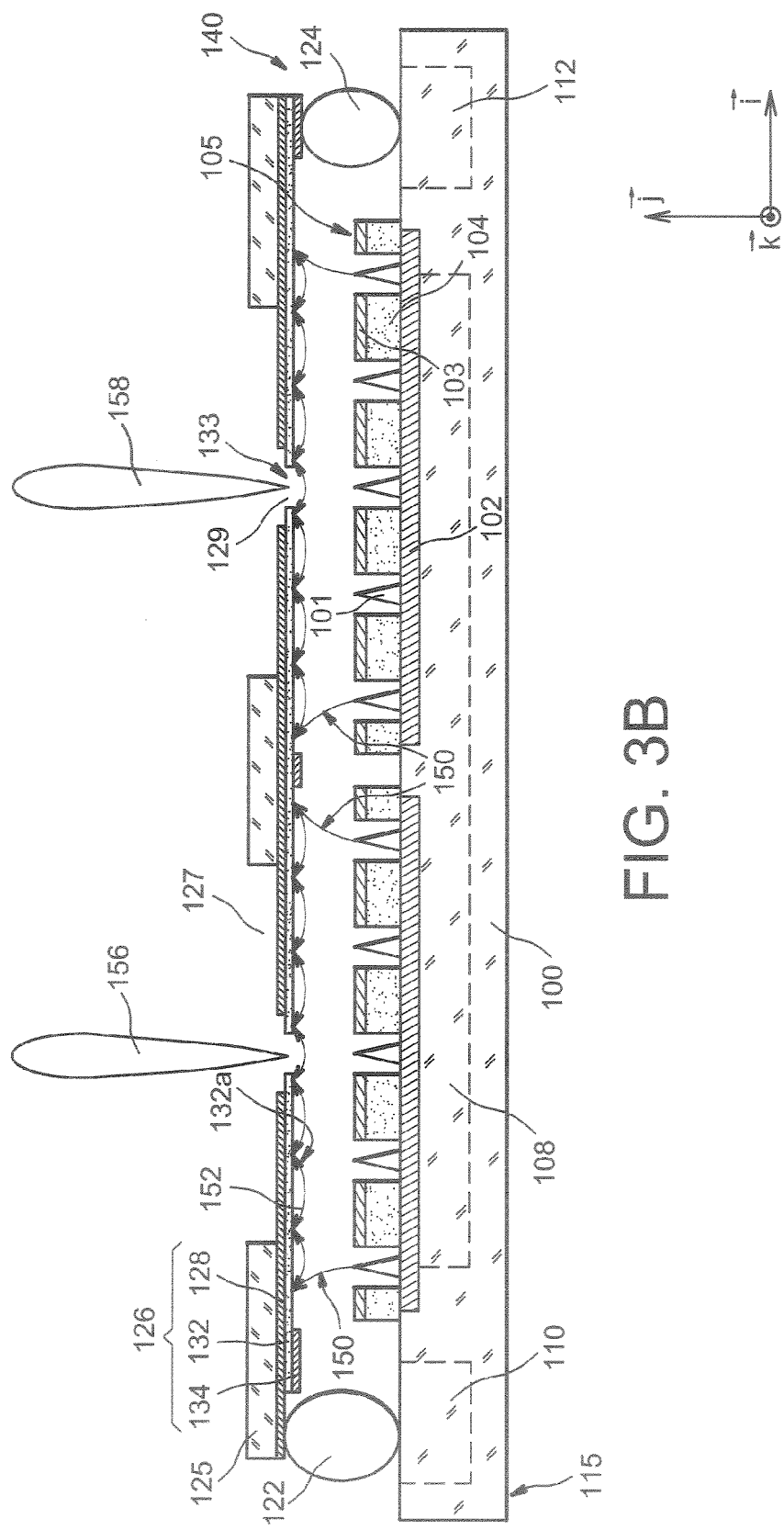
FIG. 3B illustrates a method of operating a device according to the invention.

The operation of the device may be as follows: when the micro-sources 101 of a pixel 105 emit primary electrons (the emission of primary electrons being represented by arrowed lines noted 150 in FIG. 3B), certain of these electrons are capable of entering into collision on the parts 132a of the collective layer 132 of the stacking 126, as well as on the walls of openings 133. These collisions may enable secondary electrons to be produced.

The parts 132a of the collecting layer 132 of the stacking 126 thereby collect "spatially" and average out the primary electrons from several different micro-sources.

In parallel, the first electrode and the second electrode may be polarised so as to produce a tangential and radial electrical field provided in particular with at least one component parallel to the vector $\vec{i}$ and at least one other component parallel to the vector $\vec{j}$ of the orthogonal mark [$O$; $\vec{i}$; $\vec{j}$; $\vec{k}$] indicated in FIG. 3B making it possible firstly, after if necessary several steps of reemission or jumps of secondary electrons (the emissions and jumps of secondary electrons being represented by arrowed lines noted 152 on this same FIG. 3B) produced on the parts 132a of the insulating layer 133 of the stacking 126, to convey or bring these secondary electrons towards the openings 133. These openings 133 then form a secondary source or a nano-source of electrons. The first electrode and the second electrode make it possible to group together the secondary electrons into beams of electrons 156, 158 and to accelerate the flux of electrons of these beams 156, 158 at the exit of the openings 133, then the orifices 127 and 139.

Thus, the matrix of openings 133 makes it possible to combine or average out for each pixel or emitter element 105 the spatial dispersions as well as the temporal fluctuations of the beams of electrons emitted by the micro-sources. This matrix of openings 133 also makes it possible to form secondary sources of electrons independent of spatial emission instabilities of the micro-sources 101 or primary sources.

One may obtain, at the exit of the nano-sources, beams 156, 158 each having characteristics of spatial stability and temporal stability of improved intensity by averaging effect, as well as for all of the beams, a uniformity of characteristics between said beams.

The beams of electrons 156, 158 at the exit of the openings 133 may have a small width for example of around 10 to 20 nm, and a high current density. This current density may be for example around 104 A/cm$^2$, for an emitted current of 10 nA per nanosource 133.

The device according to the invention is not limited to micro-sources of primary electrons of microtip type. Thus, according to variants of embodiments of the device previously described, the microtip based cathodes may be replaced by cathodes comprising microsources of electrons of different nature, for example carbon nanotubes such as those described in the document of J. Dijon and al, "*LN-2: Cathode Structures for Carbon Nanotubes Displays*", Proceedings of the 22$^{nd}$ international display research conference, Eurodisplay, Nice 2002. Late news papers, pp 821-624, or according to another possibility, nano-fissures such as described in the document of K. Sakai et al. "*Flat Panel Displays Based on Surface Conduction Electron emitters*", Proceedings of the 16th international display research conference, Ref 18.3L., pp 569-572.

After forming the first structure and the second structure, a step of assembling the two structures, which is also known as "hybridization", may be carried out, by means for example of conductive hybridization beads 122 and 124, formed for example in a meltable material. These beads make it possible, apart from establishing an electrical and mechanical connection between the two structures, to position in a precise manner the two matrices of micro-sources and openings in relation to each other, according to a precision of around for example a micron.

The electron emitter device capable of producing several beams of electrons 156, 158 that has just been described may be used within the scope of direct writing lithography, for forming in thin films patterns of very small critical dimension, for example around 15 or 20 nanometers.

Figure 5:
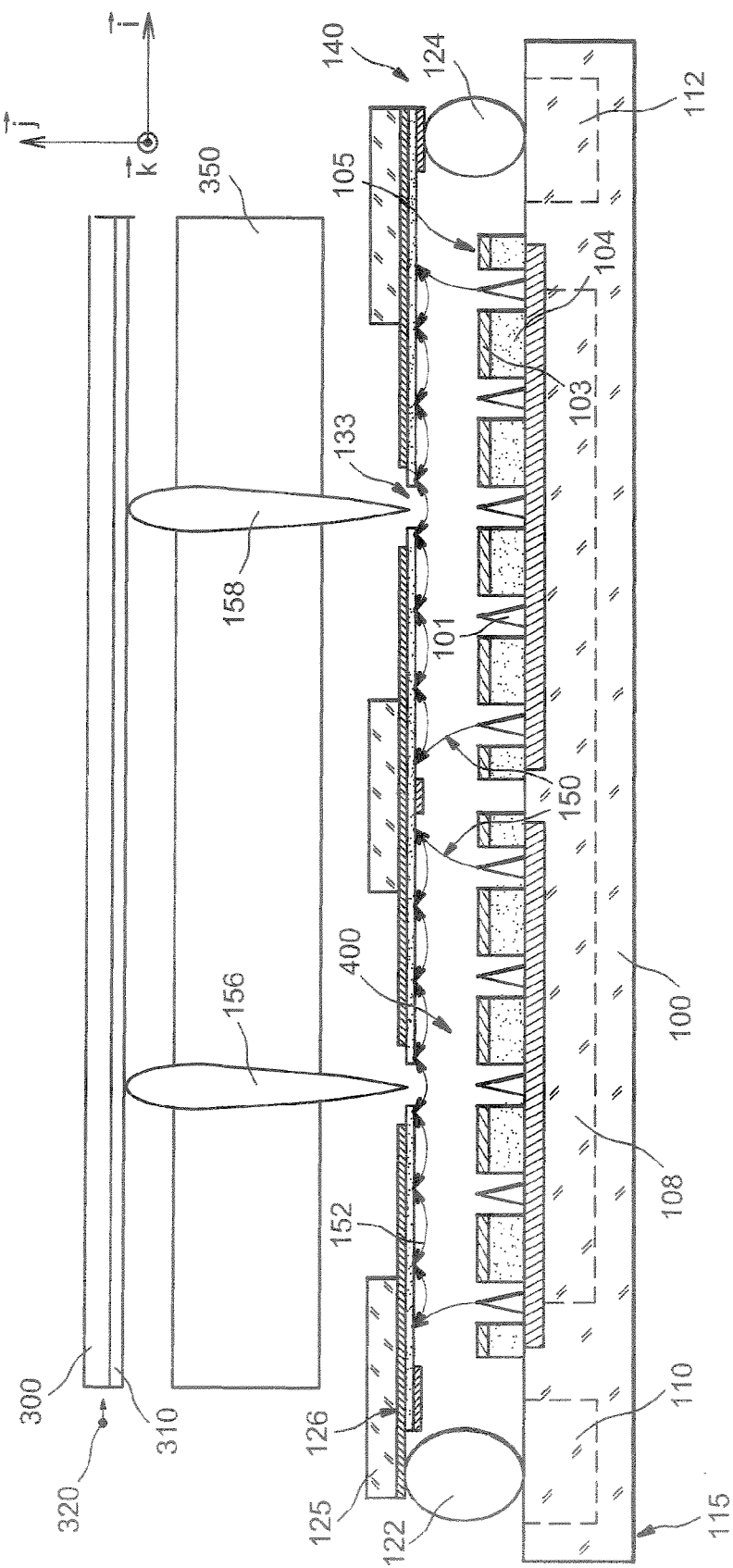
FIG. 5 illustrates a direct writing lithography device according to the invention, Identical, similar or equivalent parts of the different figures bear the same numerical reference so as to facilitate moving from one figure to another.

FIG. 5 illustrates a lithography device comprising a microelectronic electron emission device as described previously, used to form patterns in a thin film 310, for example based on resin lying on a wafer 300, for example semi-conductor. Apart from the first structure 115 capable of emitting primary electrons, associated with the second structure 140 capable of collecting primary electrons from the first structure and producing secondary electrons and in particular beams of secondary electrons 156, 158, a system or means of focusing 350 beams of electrons 156, 158, from nano-sources of electrons 133 is also provided. These focusing means may be formed from an electrostatic or/and magnetic device(s). This lithography device may further comprise polarisation means 320 to make it possible to apply a potential Va for example of around several thousands volts to the wafer 300, so that said wafer can form an anode.

The size ratio between the pixels 105 of primary emitters or micro-sources 101, and particularly between the conductive zones 102 and the openings 133, may be provided so that the micro-sources or primary emitters 101 are masked vis-à-vis return ionic bombardments. Such bombardments may be for example from elements located on the path of the beams 156, 158 as means or diaphragms 350 for shaping beams 156, 158, or instead the anode. For the conductive zones 102, for example of width d1 (d1 being defined by a distance measured in a direction parallel to a vector $\vec{i}$ of an orthogonal mark [O; $\vec{i}$; $\vec{j}$; $\vec{k}$] represented in FIG. 5) of around 10 μm, and openings 133 of diameter d2 of around 10 nanometers, the primary emitters 101 "seen" through nano-sources 133 are screened vis-à-vis parasitic return ionic bombardments. This screening of emitters 101 may make it possible to protect them in the possible case of a breakdown or a too high charging of the anode. This immunity to breakdowns may make it possible to apply a high electrostatic field between the source 101 and the anode 300, which may favour obtaining a good writing resolution in the thin film 310.

The first structure and the second structure made integral with or hybridized by the beads 122 and 124 make it possible to place the micro-sources 101 or primary emitters in a cavity 400, which may be under vacuum or placed under vacuum. The very low diameter d2 of the secondary nano-sources 133, for example around 10 nanometers, may enable a strong vacuum to be maintained in this cavity 400, for example a pressure of around 10-10 mbar. Such a strong vacuum on the side of the primary emitters or micro-sources may make it possible to improve the spatial and temporal stability of the beams 156 and 158.

The invention claimed is:

1. A lithography device including a microelectronic electronic emission device capable of emitting plural beams of electrons, said microelectronic emission device comprising:
   at least one substrate and a plurality N1 (N1>1) of micro-sources of electrons formed on the substrate; and
   means for collecting electrons from the micro-sources and emitting secondary electrons, the means for collecting including at least one collection layer situated opposite the micro-sources and in which is formed a plurality N2 (N2>1) of openings, the number N2 of openings being less than the number N1 of micro-sources, and the openings having a diameter between 1 nanometer and 50 nanometers.

2. The lithography device according to claim 1, wherein the at least one substrate and the means for collecting are hybridized by one or plural conductor elements.

3. The lithography device according to claim 2, wherein the at least one substrate and the means for collecting are hybridized by conductive beads.

4. The lithography device according to claim 3, further comprising means for focusing beams of electrons.

5. The lithography device according to claim 1, in which the collection layer belongs to a stacking of thin films, the stacking comprising, on either side of the collection layer, at least one first conductor layer configured to form a first electrode and at least one second conductor layer configured to form a second electrode.

6. The lithography device according to claim 5, in which the at least one substrate and the means for collecting are hybridized by one or plural conductor elements, and the first electrode and the second electrode are supplied by one or plural integrated circuits of the at least one substrate.

7. The lithography device according to claim 5, wherein the collection layer receives electrons.

8. The lithography device according to claim 1, wherein the collection layer is based on an insulating material.

9. The lithography device according to claim 1, wherein the openings are arranged in a matrix.

10. The lithography device according to claim 9, in which the at least one substrate comprises a matrix of pixels, each pixel comprising one or plural micro-sources.

11. The lithography device according to claim 9, wherein the at least one substrate further comprises a pixel addressing circuit.

12. The lithography device according to claim 11, wherein the openings include a first mouth of given section and a second mouth of a section greater than the first mouth.

13. The lithography device according to claim 11, further comprising means for focusing beams of electrons.

14. The lithography device according to claim 1, wherein the micro-sources are microtips, or carbon nanotubes, or nanofissures.

15. The lithography device according to claim 1, wherein the openings comprise a first mouth of given section and a second mouth of a section greater than the first mouth.

16. The lithography device according to claim 15, further comprising means for focusing beams of electrons.

17. The lithography device according to claim 1, wherein the collection layer is based on a material of secondary emission coefficient greater than 1.

18. The lithography device according to claim 1, further comprising means for focusing beams of electrons.

19. The lithography device according to claim 1 being a direct writing lithography device.

20. The lithography device according to claim 1, wherein a current density of 104 A/cm$^2$ is output from the openings.

21. The lithography device according to claim 1, wherein an emitted current of 10 nA is output per opening.

22. The lithography device according to claim 1, further comprising:
   a voltage source that applies a potential to a wafer that is to be processed by the lithography device, so that said wafer forms an anode.

23. A lithography device including a microelectronic electronic emission device capable of emitting plural beams of electrons, said microelectronic emission device comprising:

at least one substrate and a plurality N1 (N1>1) of micro-sources of electrons formed on the substrate; and an electron emitter that collects electrons from the micro-sources and emits secondary electrons, the electron emitter including at least one collection layer situated opposite the micro-sources and in which is formed a plurality N2 (N2>1) of openings, the number N2 of openings being less than the number N1 of micro-sources, and the openings having a diameter between 1 nanometer and 50 nanometers.

* * * * *